United States Patent [19]

Trinh et al.

[11] Patent Number: 5,777,926
[45] Date of Patent: Jul. 7, 1998

[54] ROW DECODER CIRCUIT FOR PMOS NON-VOLATILE MEMORY CELL WHICH USES CHANNEL HOT ELECTRONS FOR PROGRAMMING

[75] Inventors: Jayson Giai Trinh, Milpitas; Vikram Kowshik, San Jose; Andy Teng-Feng Yu, Palo Alto, all of Calif.

[73] Assignee: Programmable Microelectronics Corporation, San Jose, Calif.

[21] Appl. No.: 738,434

[22] Filed: Oct. 24, 1996

[51] Int. Cl.$^6$ .................................................. G11C 11/34
[52] U.S. Cl. .................. 365/185.19; 365/185.18; 365/230.06
[58] Field of Search .................. 365/185.19, 185.18, 365/185.23, 230.06

[56] References Cited

U.S. PATENT DOCUMENTS 5,483,485  1/1996  Maruyama .................. 365/185.18
5,610,863  3/1997  Yamada .................. 365/230.06

*Primary Examiner*—Huan Hoang
*Attorney, Agent, or Firm*—Flehr Hohbach Test; Albritton & Herbert LLP; William L. Paradice, III

[57] ABSTRACT

A row decoder circuit selectively provides suitable programming, reading, and erasing voltages to an associated memory array employing PMOS floating gate transistors as memory cells. In some embodiments, during programming, the row decoder circuit pulls a selected word line of the associated memory array high to a programming voltage on a first voltage line and maintains an un-selected word line at a predetermined potential. During reading, the row decoder circuit discharges the word line, if selected, to ground potential, and maintains the word line, if un-selected, at a predetermined potential. During erasing, the row decoder circuit charges the word line to a high negative voltage. The row decoder circuit includes isolation means to electrically isolate the word line of the associated memory array from undesirable potentials during programming, reading, and erasing operations.

17 Claims, 4 Drawing Sheets

ROW DECODER CIRCUIT FOR PMOS NON-VOLATILE MEMORY CELL WHICH USES CHANNEL HOT ELECTRONS FOR PROGRAMMING

CROSS-REFERENCE TO RELATED APPLICATIONS

This application is related to commonly owned U.S. patent application Ser. No. 08/557,589 entitled "A PMOS MEMORY CELL WITH HOT ELECTRON INJECTION PROGRAMMING AND TUNNELING ERASING", filed Nov. 14, 1995 and bearing attorney docket No. M-3546 US and to commonly owned U.S. patent application Ser. No. 05/722/428 entitled "SWITCHING CIRCUIT FOR CONTROLLED TRANSITION BETWEEN HIGH PROGRAM AND ERASE VOLTAGES AND POWER SUPPLY VOLTAGE FOR MEMORY CELLS", filed Oct. 3, 1996 and bearing attorney docket No. M-4099 US.

BACKGROUND

1. Field of the Invention

This application relates to selectively providing programming, erasing, and reading voltages to a memory array containing PMOS floating gate memory cells.

2. Description of Related Art

Row decoder circuits are well known in the art and are used to select which row of memory cells within an associated memory array are to be programmed, erased, and read. Conventional row decoder circuits are intended to operate with memory arrays which employ as memory cells NMOS floating gate devices such as, for instance, N-channel stacked gate transistors. During read operations, these row decoder circuits charge a selected row line (also known in the art as a word line) to a predetermined positive potential while the bit lines connected to the floating gate memory cells selected by the word line are charged to a constant positive potential. Sense amplifiers connected to these bit lines monitor the voltage levels on these lines and thereby determine whether the selected memory cells are in a programmed or erased state. The un-selected word lines are maintained at ground potential during read operations. During programming operations, these row decoder circuits charge the selected word lines to a high voltage while maintaining the un-selected word lines at a low voltage. During erase operations, these row decoder circuits discharge the selected word lines to a low potential such as, for instance, ground potential, while the selected bit lines are pulled to a high positive voltage such as, for instance, 12 volts.

Recent advances in semiconductor memory technology have led to the development of a PMOS floating gate memory cell, as disclosed in the commonly owned co-pending U.S. patent application Ser. No. 08/557,589 referenced above and incorporated herein by reference. Referring to FIG. 1, that co-pending application discloses in one embodiment a P-channel memory cell 10 having a channel region 12 extending between P+ source 14 and P+ drain 16 regions formed in an N– well 18 of a P– substrate 20. A floating gate 22 is insulated from the surface of N– well 18 by a thin tunneling oxide layer 24. A control gate 26 overlies floating gate 22.

Where cell 10 is selected for programming, approximately 5–9 volts is applied to P+ source 14 and N– well 18 while P+ drain 16 is held at a lower positive potential such as, for instance, approximately 2 volts. A programming voltage which is ramped from a low voltage to a higher voltage is provided to control gate 26 of cell 10 via the word line (not shown) coupled to control gate 26. In some embodiments, the programming voltage is ramped from ground potential to 6 or more volts. Positively charged holes near P+ source 14 and channel region 12 are attracted to the less positive voltage on P+ drain 16 and are accelerated through channel region 12 towards P+ drain 16. These holes collide with electrons and lattice atoms in a drain depletion region 30, thereby resulting in impact ionization. The high energy electrons generated from impact ionization, attracted by the positive voltage on control gate 26, are injected from depletion region 30 into floating gate 22. The resultant negative charge on floating gate 22 depletes channel region 12 of electrons, thereby resulting in a more positive threshold voltage $V_T$ for cell 10.

Cell 10 may in some embodiments be erased by applying a positive voltage to P+ source 14, P+ drain 16, and N– well 18, while applying a negative voltage to control gate 26 via the selected word line. Electrons tunnel from floating gate 22 across the entire length of tunneling oxide layer 24 into channel 12, source 14, and drain 16, thereby returning the threshold voltage of cell 10 to that of its erased state.

Cell 10 may in some embodiments be selected for reading by grounding the selected word line, i.e., control gate 26, and coupling a positive read voltage such as, for instance $V_{cc}$, to P+ source 14 and N– well 18. A voltage less than $V_{cc}$ is applied to P+ drain 16. Thus, selected cell 10 will conduct a channel current only if cell 10 is programmed, i.e., only if charge is stored in floating gate 22.

The operation of a memory array containing a plurality of PMOS memory cells such as cell 10 presents challenges very different from those presented by conventional memory arrays that employ NMOS transistors as memory cells. Indeed, conventional row decoders circuits will not operate properly with a memory array containing PMOS memory cells such as cell 10. For instance, since the gate potential of a PMOS transistor device must remain slightly below its source potential in order to conduct current, the bit lines to which the P+ drains of associated PMOS memory cells 10 are coupled must be discharged to ground and the P+ sources of the PMOS memory cells must be charged to a high positive potential prior to read operations.

As mentioned above, in conventional NMOS memories the selected word lines are charged to a high voltage and the un-selected word lines are maintained at ground potential during program operations. During read operations of memory arrays containing NMOS memory cells, selected word lines are maintained at a positive potential while un-selected word lines are maintained at a low potential. In contrast, during program operations, the selected word lines in a memory array employing PMOS cells 10 should be ramped from a low voltage to a high voltage level while the un-selected word lines should be maintained at a predetermined constant positive potential. During read operations of such a PMOS memory array, the selected word lines are maintained at a low positive voltage level while the un-selected word lines are maintained at a higher positive voltage level. Further, the row decoder circuit associated with such a PMOS memory array should, during erase operations, be able to provide a negative high voltage to the selected word lines.

SUMMARY

In accordance with the present invention, a row decoder circuit is provided which may selectively provide suitable programming, reading, and erasing voltages to an associated memory array employing PMOS floating gate transistors as memory cells. During programming, the row decoder circuit provides a ramped voltage to the selected word line of the associated memory array and maintains all the un-selected word lines at a predetermined positive high voltage. During reading, the row decoder circuit discharges the word line, if selected, to ground potential, and maintains the word line, if un-selected, at a predetermined potential. During erasing, the row decoder circuit charges the word line to a high negative voltage. The row decoder circuit includes isolation means to electrically isolate the word line of the associated memory array from undesirable potentials during programming, reading, and erasing operations.

DETAILED DESCRIPTION

Figure 1:
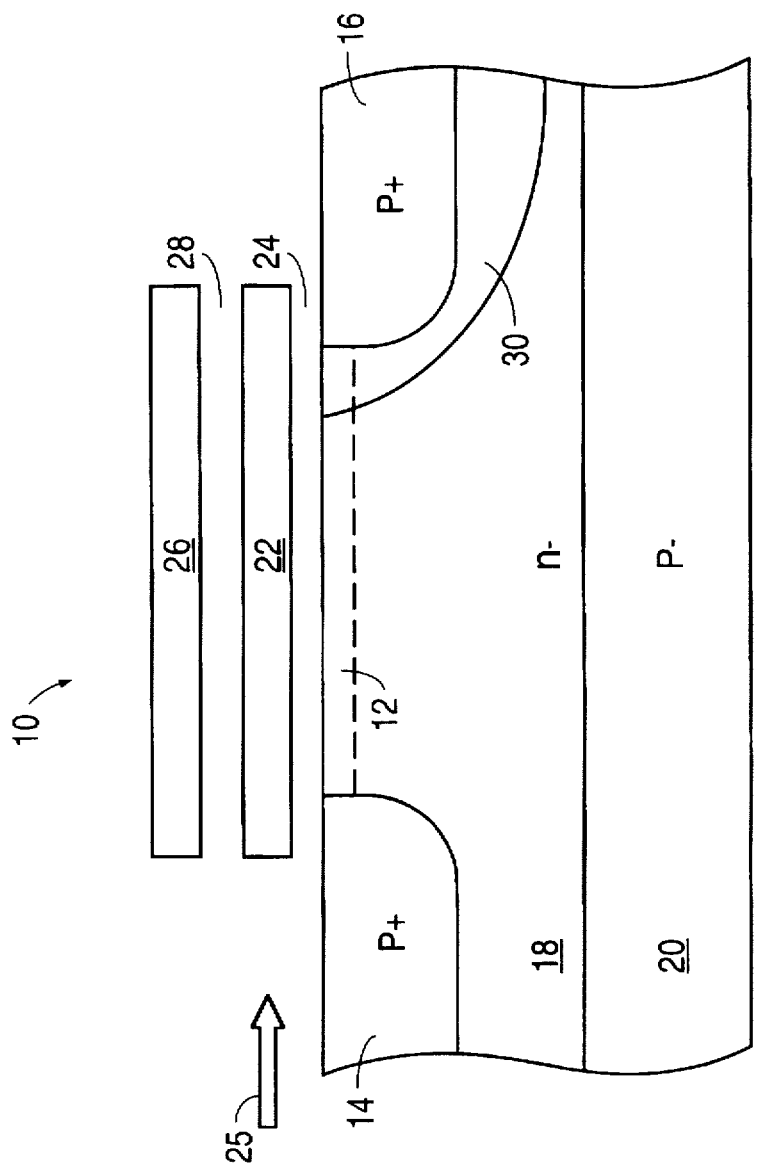
FIG. 1 is a cross-sectional view of a PMOS floating-gate memory cell in accordance with the above-mentioned corresponding U.S. patent application Ser. No. 08/557,589.
Figure 2:
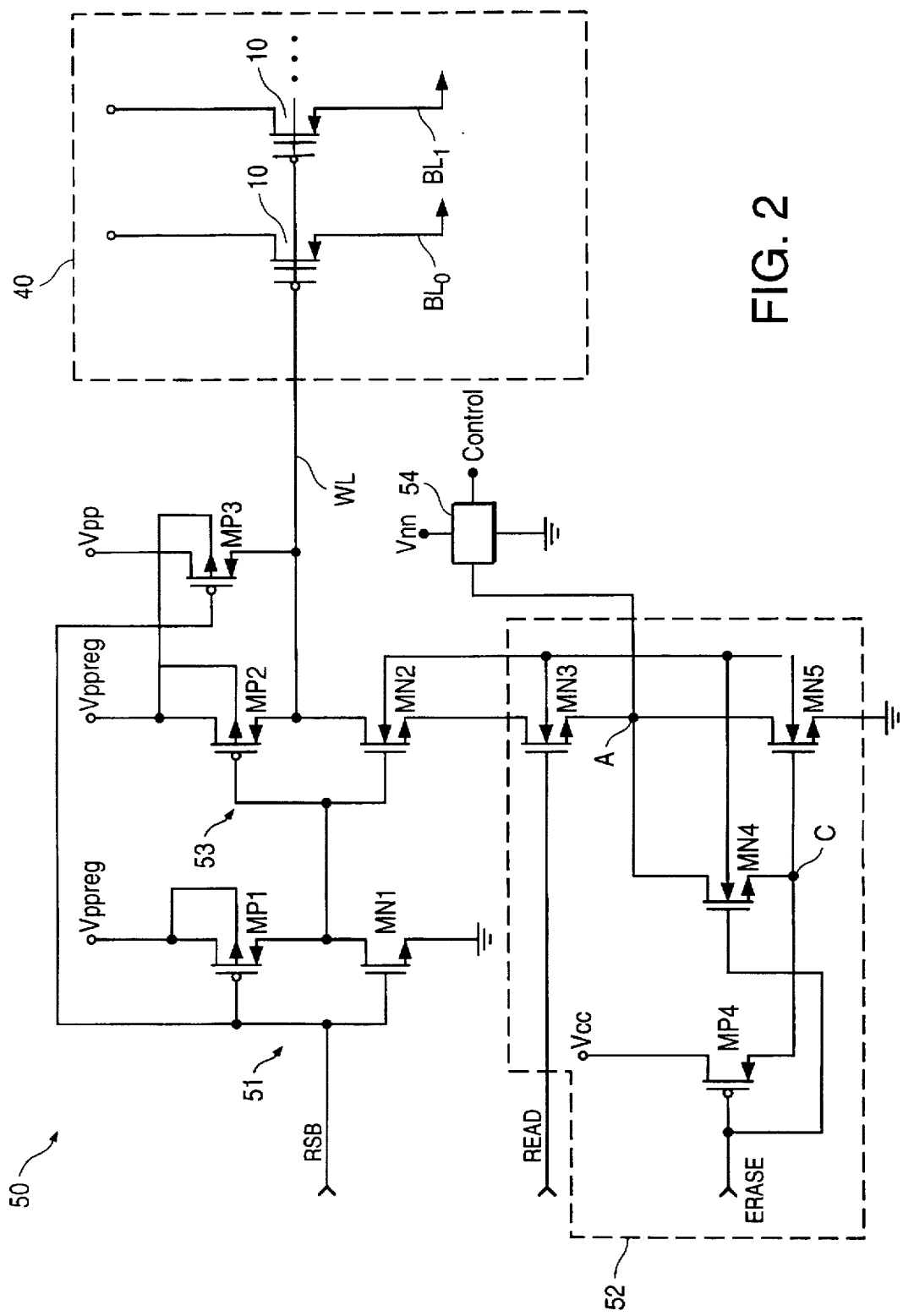
FIG. 2 is a schematic diagram of a row decoder circuit in accordance with one embodiment of the present invention.

Referring to FIG. 2, embodiments of the present invention are discussed below in the context of a memory array 40 employing as memory cells PMOS floating gate transistors such as, for instance, cell 10 described above and shown in FIG. 1. It is to be understood, however, that this invention may be used with arrays which employ other PMOS memory cells, or in conjunction with any circuit which requires the selective application of various potentials as described below. Although not shown in FIG. 2 for simplicity, in actual embodiments memory array 40 will usually have numerous word lines WL each of which connected to an associated one of row decoder circuits 50.

As mentioned above, the various program, read, and erase operations of a memory array employing PMOS memory cells 10 are different from those of conventional memory arrays containing NMOS flash or NMOS EEPROM cells and, accordingly, present unique challenges for the row decoder circuits associated therewith. For instance, during program operations the selected word lines of memory array 40 are connected to a programming voltage which in some embodiments ramps from a low voltage such as, for instance, ground potential to a higher voltage level such as, for instance, 6 volts, while the un-selected word lines are maintained at the higher voltage level, e.g., 6 volts. Further, during read operations, the selected word lines WL of memory array 40 should be maintained at a low voltage level and the un-selected word lines should be maintained at a high voltage level such as, for instance, the supply voltage $V_{cc}$ which, in some embodiments, may be approximately 3 volts, although in other embodiments higher or lower supply voltages may be used. Moreover, when reading selected ones of PMOS cells 10 within array 40, the selected bit lines $BL_x$ are discharged to a low potential such as, for instance, ground potential, while the selected word lines are grounded. During such read operations, the sources of the selected ones of memory cells 10 are held at a high potential such as, for instance, the supply voltage $V_{cc}$. If the selected one of cells 10 is programmed, that one of cells 10 will conduct current and thereby charge its associated selected bit line to a higher potential. If, on the other hand, the selected one of cells 10 is not programmed, that one of cells 10 will not conduct current and its associated selected bit line will remain at the low "discharged" potential. An associated sense amplifier (not shown) monitors the resultant voltage on the selected bit line $BL_x$ and thereby determines the binary state of the one of cells 10 selected for reading.

Decoder circuit 50 is coupled to receive control signals RSB, READ, and ERASE. Signal RSB is provided as an input signal to a CMOS inverter 51 which is formed by NMOS transistor MN1 and PMOS transistor MP1 and coupled between a regulated voltage line $V_{ppreg}$ and ground potential. The output terminal of inverter 51 is connected to the commonly coupled gates of PMOS transistor MP2 and NMOS transistor MN2. Transistors MP2 and MN2 form a CMOS inverter 53, the output terminal of which is connected to word line WL. The source of transistor MP2 is connected to line $V_{ppreg}$, while the source of transistor MN2 is connected to the drain of NMOS transistor MN3. A PMOS transistor MP3 is connected between program line $V_{pp}$ and word line WL and has a gate coupled to receive signal RSB. The bulks of transistors MP2 and MP3 are electrically connected to the source of transistor MP2.

The gate of transistor MN3 is connected to receive signal READ, and the source of transistor MN3 is connected to the respective drains of transistors MN4 and MN5. A PMOS transistor MP4 has a gate coupled to receive signal ERASE, a source connected to the voltage supply $V_{cc}$, and a drain connected to the source of transistor MN4 and to the gate of transistor MN5. The source of transistor MN5 is connected to ground potential. The bulks of each of NMOS transistors MN2, MN3, MN4, and MN5 are electrically coupled together and, in preferred embodiments, transistors MN2, MN3, MN4, and MN5 are fabricated using a well known CMOS triple well technology. The source of transistor MN3 (node A) is selectively coupled to a negative high voltage line $V_{nn}$ or to ground potential via a tri-state switch 54. The state of tri-state switch 54 is controlled by one or more control signals.

Figure 4:
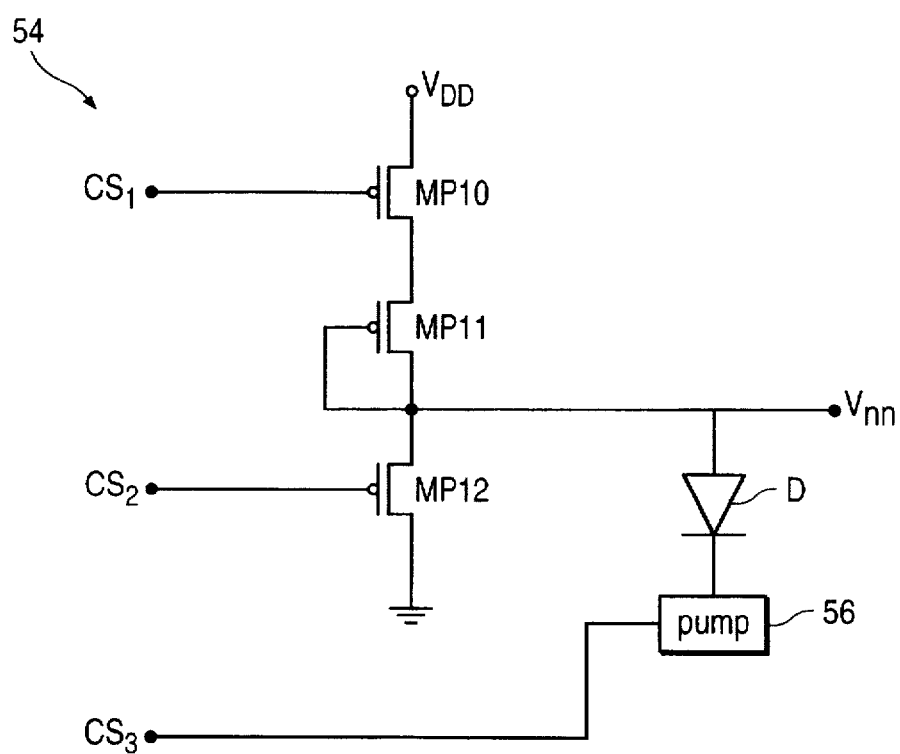
FIG. 4 is a schematic diagram of a switch employed in some embodiments of the present invention.

Referring to FIG. 4, switch 54 includes three PMOS transistors MP10, MP11, and MP12 coupled in series between a supply voltage $V_{DD}$ and ground potential. Transistor MP11 is connected as a diode. The commonly coupled drain of transistor MP11 and source of transistor MP12 are connected to voltage line $V_{nn}$. A diode D has an anode coupled to voltage line $V_{DD}$ and a cathode coupled to a conventional negative charge pump 56. Control signals $CS_1$, $CS_2$, and $CS_3$ are provided to the gate of transistor MP10, the gate of transistor MP12, and to a control terminal of negative charge pump 56, respectively.

As will be explained below, it is desirable to provide a negative high voltage at node A in FIG. 2 during erasing operations. Thus, during erasing operations, control signal $CS_3$ is in a logic high state so as to activate negative charge pump 56 which, in conjunction with diode D, charges voltage line $V_{nn}$ to a negative high voltage such as, for instance, -8 volts. Transistor MP11 isolates the drain of transistor MP10 from the negative high voltage on line $V_{nn}$. Control signal $CS_1$ is maintained in a logic high state to keep transistor MP10 off. Note that since during erasing operations the source of PMOS transistor MP12 is at the negative high voltage on line $V_{nn}$, transistor MP12 will remain in an off state regardless of the logic state of control signal $CS_2$.

During reading and programming operations, it is desirable for reasons discussed below to connect node A to ground potential. Thus, during reading and programming operations, control signal $CS_3$ is transitioned to a logic low state to turn off negative charge pump 56. Control signal $CS_1$ is pulsed to a logic low state to turn on transistor MP10 and thereby pull voltage line $V_{nn}$ towards $V_{DD}$. As the voltage on line $V_{nn}$ approaches a maximum value of $V_{DD}-V_{tp}$, where $V_{tp}$ is the threshold voltage of transistor MP10, control signal $CS_1$, is returned to a logic high state to turn off transistor MP10, and control signal $CS_2$ is transitioned to a logic low state to turn on transistor MP12. Once conducting, transistor MP12 pulls voltage line $V_{nn}$, and thus node A, towards ground potential (e.g., $V_{tp}$, where $V_{tp}$ is the threshold voltage of transistor MP12).

If it is desired to connect node A to a floating potential, i.e., to allow voltage line $V_{nn}$ to float, control signals $CS_1$, $CS_2$, and $CS_3$ may be set to logic high, logic high, and logic low levels, respectively. In this manner, transistors MP10 and MP12 are held in a non-conductive state and negative charge pump 56 is inactive, thereby allowing voltage line $V_{nn}$ to float.

PROGRAMMING OPERATIONS

During programming, a positive charge pump and voltage regulator (not shown) associated with memory array 40 in FIG. 2 are active and provide in a well known manner a regulated high voltage such as, for instance, 6 volts or higher on line $V_{ppreg}$. A programming voltage $V_p$ is provided on line $V_{pp}$ by an associated voltage control circuit (not shown). Signal READ is maintained at a logic low level and thus keeps transistor MN3 in a non-conductive state and thereby provides electrical isolation between transistor MN2 and ground potential during programming. Signal ERASE is also maintained at a logic low level, thereby maintaining transistor MN4 in a non-conductive state while turning on transistor MP4 during programming. The conductive state of transistor MP4 pulls the gate of transistor MN5 high to the supply voltage $V_{cc}$, thereby turning on transistor MN5. Tri-state switch 54 is operated as described above to connect node A to ground potential during programming. Note, however, that in other embodiments tri-state switch 54 may be operated to connect node A to a floating potential during programming.

Figure 3A:
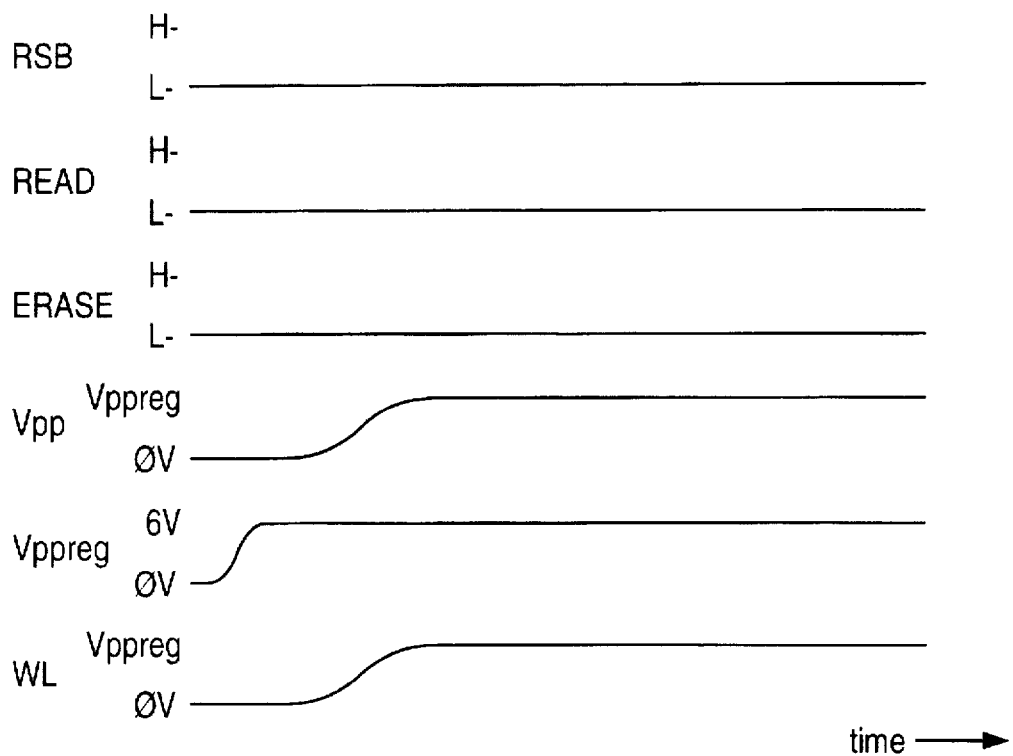
FIGS. 3A–3C are electric potential waveforms illustrative of programming, reading, and erasing operations, respectively, of the row decoder circuit of FIG. 2.

If it is desired to select word line WL for programming, signal RSB is maintained in a logic low state and turns on transistor MP3 which, once conductive, pulls word line WL high to the programming voltage $V_p$ provided, as described earlier, on line $V_{pp}$. In this manner, the programming voltage $V_p$ on line $V_{pp}$ is provided to the control gates of memory cells 10 associated with selected word line WL, thereby facilitating the programming of the selected cells 10. In those embodiments in which cells 10 of array 40 are programmed via hot electron injection, a voltage ramping circuit such as that disclosed in the above referenced U.S. patent application Ser. No. 08/722,429, and bearing attorney docket number M-4099, incorporated herein by reference, may be employed to provide a ramped programming voltage on line $V_{pp}$. In such embodiments, the programming voltage $V_p$ applied to the control gate 26 (FIG. 1) of a selected cell 10 of array 40 may be ramped from a low voltage such as, for instance, ground potential, to a high voltage such as, for instance, 6 volts, so as to facilitate the injection of hot electrons into floating gate 22 of the selected cell 10, as described above. Thus, referring to FIG. 3A, the voltage on a selected word line WL will follow the programming voltage $V_p$ provided on line $V_{pp}$. Of course, the ramp rate of the voltage on word line WL and line $V_{pp}$, as depicted in FIG. 3A, may vary depending upon the particular control device, e.g., ramping circuit, employed to provide the programming voltage $V_p$. The timing of program waveforms shown in FIG. 3A is merely illustrative and should not be construed in a limiting manner; circuit 50 will operate as described above, and the voltage on word line WL will follow the ramping voltage on line $V_{pp}$, as long as the voltage on $V_{ppreg}$ is pulled high to, for instance, 6 volts before the voltage on line $V_{pp}$ is ramped.

The logic low state of signal RSB also causes the output terminal of inverter 51 in FIG. 2 to transition high to the voltage on line $V_{ppreg}$ (i.e., 6 volts). In response thereto, transistor MP2 turns off and transistor MN2 turns on. The non-conductive state of transistor MP2 provides electrical isolation between word line WL and line $V_{ppreg}$.

If it is not desired to select word line WL for programming, signal RSB is maintained in a logic high state, thereby forcing the output terminal of invertor 51 low to ground which, in turn, turns off transistor MN2 and turns on transistor MP2. As a result, word line WL is pulled high to the voltage level on line $V_{ppreg}$ (i.e., 6 volts). The logic high state of signal RSB also turns off transistor MP3, thereby electrically isolating word line WL from the programming voltage $V_p$ on line $V_{pp}$ when word line WL is not selected for programming.

READING OPERATIONS

During reading, the positive charge pump circuit (not shown) associated with memory array 40 is inactive, and the voltage on line $V_{ppreg}$ is maintained at the supply voltage $V_{cc}$. Line $V_{pp}$ is held at ground potential. Switch 54 is preferably operated to connect the source of transistor MN3 (node A) to ground potential during read operations, as described earlier. In other embodiments, however, switch 54 may be operated to connect node A to a floating potential during read operations. Signal READ is pulled to a logic high state, thereby turning on transistor MN3. Signal ERASE is maintained in a logic low state and, as described above, turns on transistor MN5.

Figure 3B:
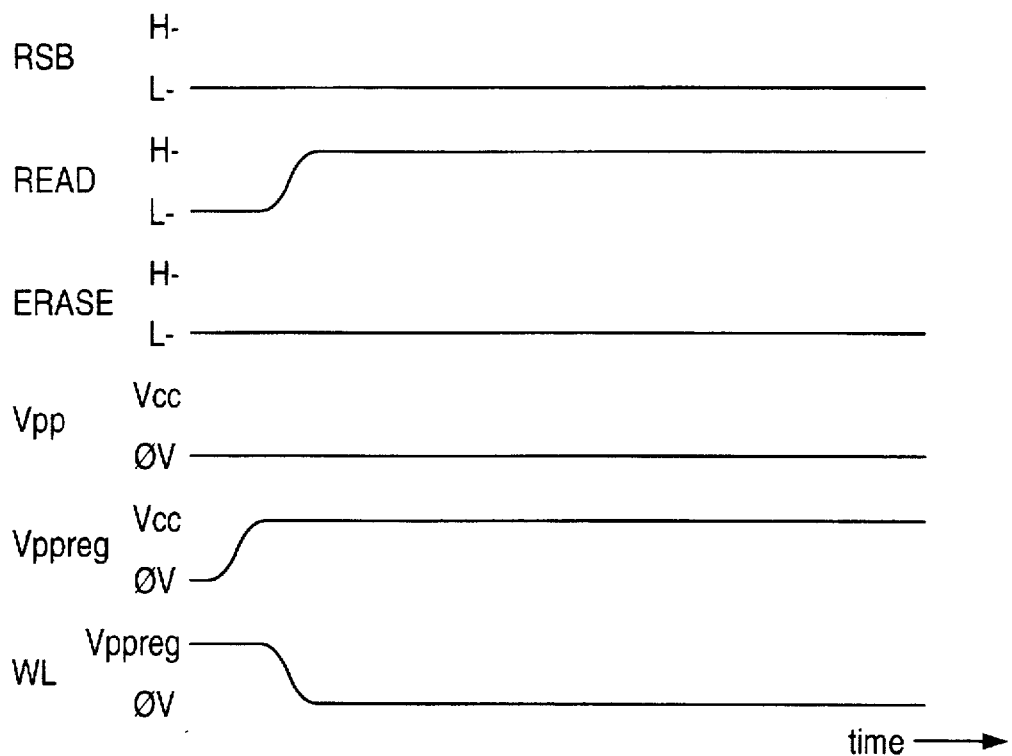

If it is desired to select word line WL for reading, signal RSB is maintained in a logic low state and, as discussed earlier, turns on transistors MN2 and MP3 and turns off transistor MP2. The conductive state of transistor MP3 provides a current path from selected word line WL to line $V_{pp}$ which, as mentioned above, is held at ground potential during read operations, thereby allowing selected word line WL to discharge towards ground potential. The conductive states of transistors MN2, MN3, and MN5 provide an alternate current path between selected word line WL and ground potential, thereby increasing the speed with which selected word line WL may discharge to ground. Transistor MP2, being in a non-conductive state, provides electrical isolation between selected word line WL and line $V_{ppreg}$ during read operations. Thus, row decoder circuit 50 provides a read voltage of approximately zero volts to the control gates 26 (FIG. 1) of cells 10 selected for reading. Electric potential waveforms illustrative of the above-described signals and lines during reading are provided in FIG. 3B. The timing of read waveforms shown in FIG. 3B is merely illustrative and should be construed in a limiting manner; circuit 50 will operate as described above, and the voltage on word line WL will discharge to ground potential, as long as the voltage on line $V_{ppreg}$ is pulled to $V_{cc}$ before signal READ is pulled to a logic high level.

If it is not desired to select word line WL for reading, signal RSB is maintained in a logic high state, thereby turning off transistors MN2 and MP3 while turning on transistor MP2 in FIG. 2. Transistor MP2 electrically connects un-selected word line WL to line $V_{ppreg}$ and, recalling that line $V_{ppreg}$ is maintained at $V_{cc}$ during read operations, thereby pulls un-selected word line WL high to $V_{cc}$. Transistor MN2 provides electrical isolation between un-selected word line WL and ground via transistor MN3, and transistor MP3 provides electrical isolation between un-selected word line WL and ground potential via line $V_{pp}$.

ERASING OPERATIONS

During erasing, the positive charge pump (not shown) associated with memory array 40 is inactive, and lines $V_{ppreg}$ and $V_{pp}$ are maintained at ground potential. During erasing, switch 54 is operated as described above to connect the source of transistor MN3 (node A) to line $V_{nn}$, thereby pulling the source of transistor MN3 to the negative high voltage (e.g., −8 volts) on line $V_{nn}$. Signal READ is maintained in a logic low state, and signal ERASE is maintained in a logic high state. In preferred embodiments, row decoder circuit 50 is intended to facilitate page mode and bulk mode erasing operations, i.e., the control gates of all memory cells within a page or within the bulk are pulled to the negative high voltage. Accordingly, since it is not necessary to select particular word lines WL within memory array 40 for erasing, the logic state of signal RSB is irrelevant during erasing operations. Note, however, that in other embodiments the operation of row decoder circuit 50, as will described below, may be modified to facilitate a byte mode erase. For instance, switch 54 may be operated to selectively connect node A to the negative high voltage on line $V_{nn}$ and to ground potential, thereby selecting word line WL for erasing (cell 10 will not erase unless a sufficient bias voltage exists between its control gate and its well region to facilitate the tunneling of electrons from its floating gate).

During erasing the sources of PMOS transistors MP1, MP2, and MP3 are each at ground potential (lines $V_{ppreg}$ and $V_{pp}$ are held at ground potential during erasing). The output terminal of inverter 51, and thus the gate of transistor MP2, is therefore at a potential proximate to ground. Since the gate potential of transistor MP2 can thus not fall below the source potential of transistor MP2, transistor MP2 remains in a non-conductive state and thereby provides electrical isolation between word line WL and line $V_{ppreg}$ (i.e., ground) during erasing. In a similar manner, the gate potential of transistor MP3 cannot fall below the source potential of transistor MP3, irrespective of the logic state of signal RSB, and, thus, transistor MP3 remains in a non-conductive state and thereby provides electrical isolation between word line WL and line $V_{pp}$ (i.e., ground) during erasing.

The negative high voltage on line $V_{nn}$ is coupled to the source of NMOS transistor MN3 via switch 54 and creates a sufficient gate-to-source voltage differential in transistor MN3 to turn on transistor MN3. Once conducting, transistor MN3 couples this negative high voltage to the source of NMOS transistor MN2, thereby creating a sufficient voltage difference between the gate and source of transistor MN2 to turn on transistor MN2. In this manner, the negative high voltage (e.g., −8 volts) provided on line $V_{nn}$ is coupled to word line WL via transistors MN2 and MN3, thereby allowing for this negative high voltage to be applied to the control gates 26 (FIG. 1) of cells 10 within array 40 to facilitate the erasing of cells 10 by, for instance, electron tunneling.

Figure 3C:
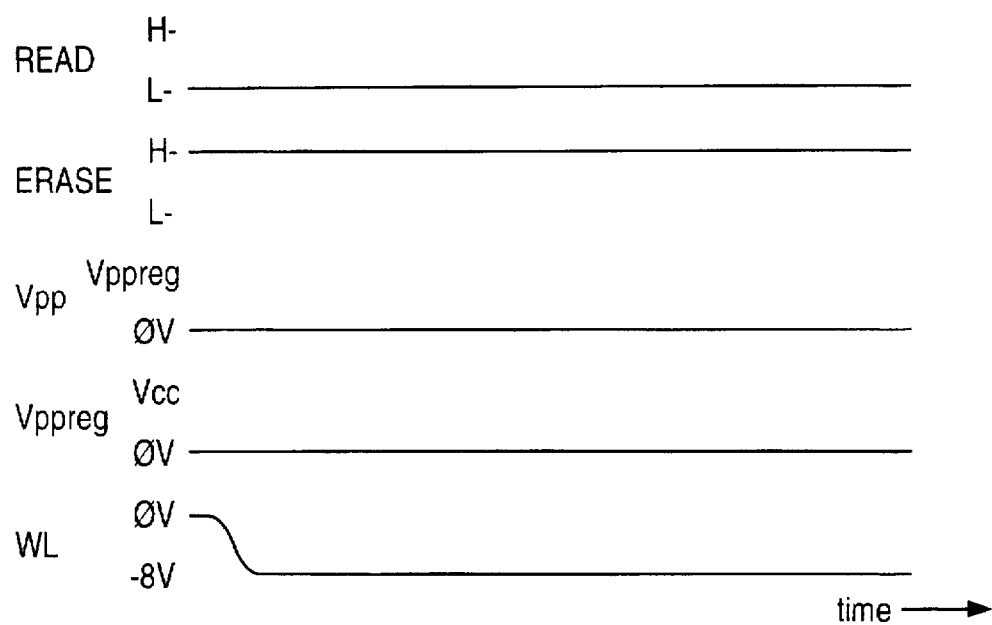

The logic high state of signal ERASE turns on transistor MN4 which, in turn, couples the negative high voltage on line $V_{nn}$ to the gate of transistor MN5 and thereby ensures that transistor MN5 remains in a non-conductive state during erasing so as to electrically isolate line $V_{nn}$ from ground potential. If the gate of transistor MN5 were not pulled to a negative high voltage, the negative high voltage coupled from line $V_{nn}$ to the drain of transistor MN5 via switch 54 would cause transistor MN5 to turn on. If allowed to conduct during erasing, transistor MN5 would create a low-impedance path between word line WL and ground potential and thereby undesirably discharge word line WL to ground. Electric potential waveforms illustrative of the above-described signals and lines during erasing are provided in FIG. 3C. The timing of erase waveforms shown in FIG. 3C is merely illustrative and should be construed in a limiting manner; word line WL will be pulled to the negative high voltage on line $V_{nn}$ in response to signal ERASE transitioning to a logic high level.

Table 1 below provides an example of the operating voltages provided to memory array 40 by row decoder circuit 50 during program, read, and erase operations.

TABLE 1

| operation | selected word line | un-selected word line | line $V_{ppreg}$ | line $V_{pp}$ | node A |
|---|---|---|---|---|---|
| program | connected to line $V_{pp}$ | line $V_{ppreg}$ | 6 or more V | ramped from 0 to 6 or more V | ground |
| erase | node A | 0 V | 0 V | 0 V | $V_{nn}$ (−8 V) |
| read | 0 V | $V_{cc}$ | $V_{cc}$ | 0 V | ground |

While particular embodiments of the present invention have been shown and described, it will be apparent to those skilled in the art that changes and modifications may be made without departing from this invention in its broader aspects and, therefore, the appended claims are to encompass within their scope all such changes and modifications as fall within the true spirit and scope of this invention. For instance, the particular voltages given in the description above are merely illustrative of the present invention; actual embodiments may employ voltages other than those given above.

We claim:

1. A row decoder circuit for selectively providing reading, programming, and erasing voltages to a word line of an associated memory array employing PMOS floating gate transistors as memory cells, said row decoder circuit comprising:

a first transistor coupled between said word line and a first voltage line and having a gate coupled to receive a select control signal, said first transistor pulling said word line to a first potential on said first voltage line in response to said select control signal indicating said word line is selected for a reading, programming or erasing operation and electrically isolating said word line from said first voltage line in response to said select control signal indicating said word line is not selected for one of said operations; and a second transistor coupled between said word line and a second voltage line and having a gate coupled to receive said select control signal, said second transistor pulling said word line to a second potential on said second voltage line in response to said select control signal indicating said word line is not selected for one of said operations and electrically isolating said word line from said second voltage line in response to said

9 select control signal indicating said word line is selected for one of said operations, wherein during said programming operation said first potential is ramped from a low potential to a high potential.

2. A row decoder circuit for selectively providing reading, programming, and erasing voltages to a word line of an associated memory array employing PMOS floating gate transistors as memory cells, said row decoder circuit comprising:

a first transistor coupled between said word line and a first voltage line and having a gate coupled to receive a select control signal, said first transistor pulling said word line to a first potential on said first voltage line in response to said select control signal indicating said word line is selected for a reading, programming or erasing operation and electrically isolating said word line from said first voltage line in response to said select control signal indicating said word line is not selected for one of said operations; and a second transistor coupled between said word line and a second voltage line and having a gate coupled to receive said select control signal, said second transistor pulling said word line to a second potential on said second voltage line in response to said select control signal indicating said word line is not selected for one of said operations and electrically isolating said word line from said second voltage line in response to said select control signal indicating said word line is selected for one of said operations, wherein during said programming operation said first potential comprises a ramped potential from approximately ground potential to approximately said second potential.

3. A row decoder circuit for selectively providing reading, programming, and erasing voltages to a word line of an associated memory array employing PMOS floating gate transistors as memory cells, said row decoder circuit comprising:

a first transistor coupled between said word line and a first voltage line and having a gate coupled to receive a select control signal, said first transistor pulling said word line to a first potential on said first voltage line in response to said select control signal indicating said word line is selected for a reading, programming or erasing operation and electrically isolating said word line from said first voltage line in response to said select control signal indicating said word line is not selected for one of said operations; and a second transistor coupled between said word line and a second voltage line and having a gate coupled to receive said select control signal, said second transistor pulling said word line to a second potential on said second voltage line in response to said select control signal indicating said word line is not selected for one of said operations and electrically isolating said word line from said second voltage line in response to said select control signal indicating said word line is selected for one of said operations, wherein during said programming operation said first potential comprises a pulsed potential from approximately ground potential to approximately said second potential.

4. A row decoder circuit for selectively providing reading, programming, and erasing voltages to a word line of an associated memory array employing PMOS floating gate transistors as memory cells, said row decoder circuit comprising:

a first transistor coupled between said word line and a first voltage line and having a gate coupled to receive a

10 select control signal, said first transistor pulling said word line to a first potential on said first voltage line in response to said select control signal indicating said word line is selected for a reading, programming or erasing operation and electrically isolating said word line from said first voltage line in response to said select control signal indicating said word line is not selected for one of said operations;

a second transistor coupled between said word line and a second voltage line and having a gate coupled to receive said select control signal, said second transistor pulling said word line to a second potential on said second voltage line in response to said select control signal indicating said word line is not selected for one of said operations and electrically isolating said word line from said second voltage line in response to said select control signal indicating said word line is selected for one of said operations;

a third transistor having a gate coupled to receive a READ signal and having a source and a drain;

first means selectively connecting said drain of said third transistor to said word line in response to said select control signal; and second means connecting said source of said third transistor to ground potential.

5. The row decoder circuit of claim 4, wherein said first means comprises a fourth transistor having a drain connected to said word line, a gate coupled to receive the complement of said select control signal, and a source connected to said drain of said third transistor.

6. The circuit of claim 5, further comprising a switch selectively connecting said source of said third transistor to a negative voltage line having a negative high potential provided thereon during said erasing operations.

7. The circuit of claim 5, wherein said second means comprises a fifth transistor having a drain connected to said source of said third transistor, a source connected to ground potential, and having a gate selectively coupled, in response to an ERASE signal, either to a supply voltage or to a negative high voltage.

8. The row decoder circuit of claim 7, further comprising a sixth transistor having a drain connected to said source of said third transistor and to said drain of said fifth transistor, a source connected to the gate of said fifth transistor, and a gate coupled to receive said ERASE signal.

9. The row decoder circuit of claim 8, further comprising a seventh transistor having a source connected to a supply voltage, a drain connected to the gate of said fifth transistor, and a gate coupled to receive said ERASE signal.

10. A row decoder circuit for selectively providing reading, programming, and erasing voltages to a word line of an associated memory array employing PMOS floating gate transistors as memory cells, said row decoder circuit comprising:

a first transistor coupled between said word line and a first voltage line and having a gate coupled to receive a select control signal, said first transistor pulling said word line to a first potential on said first voltage line in response to said select control signal indicating said word line is selected for a reading, programming or erasing operation and electrically isolating said word line from said first voltage line in response to said select control signal indicating said word line is not selected for one of said operations;

a second transistor having a gate coupled to receive a READ signal and having a source and a drain;

first means selectively connecting said drain of said second transistor to said word line in response to said select control signal; and second means connecting said source of said second transistor to ground potential.

11. The row decoder circuit of claim 10, further comprising a fifth transistor coupled between said word line and a second voltage line and having a gate coupled to receive said select control signal.

12. The row decoder circuit of claim 10, wherein during said programming operation said first potential is ramped from a low potential to a high potential.

13. The row decoder circuit of claim 10, wherein during said programming operation said first potential comprises a ramped potential from approximately ground potential to approximately said second potential.

14. The row decoder circuit of claim 10, wherein during said reading operation said first potential is ground potential and said second potential is a supply voltage of said row decoder circuit.

15. The row decoder circuit of claim 10, wherein said first means comprises a third transistor having a drain connected to said word line, a gate coupled to receive said select control signal, and a source connected to said drain of said second transistor.

16. The circuit of claim 15, wherein said second means comprises a fourth transistor having a gate coupled to receive an ERASE signal, a drain connected to said source of said second transistor, and a source connected to ground potential.

17. The circuit of claim 16, further comprising a switch selectively connecting said source of said second transistor to a negative voltage line having a negative high potential provided thereon during said erasing operations.

* * * * *